(12) United States Patent
Riviere et al.

(10) Patent No.: US 9,275,977 B2
(45) Date of Patent: Mar. 1, 2016

(54) ELECTRONIC SYSTEM COMPRISING STACKED ELECTRONIC DEVICES PROVIDED WITH INTEGRATED-CIRCUIT CHIPS

(71) Applicant: STMicroelectronics (Grenoble 2) SAS, Grenoble (FR)

(72) Inventors: Jean-Michel Riviere, Froges (FR); Nadine Martin, Champ sur Drac (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 18 days.

(21) Appl. No.: 14/524,906

(22) Filed: Oct. 27, 2014

(65) Prior Publication Data

US 2015/0115424 A1 Apr. 30, 2015

(30) Foreign Application Priority Data

Oct. 30, 2013 (FR) .................................... 13 60584

(51) Int. Cl.
*H01L 23/52* (2006.01)
*H01L 25/065* (2006.01)
*H01L 25/10* (2006.01)
*H01L 23/367* (2006.01)
*H01L 23/498* (2006.01)
*H01L 23/538* (2006.01)
*H01L 23/40* (2006.01)

(52) U.S. Cl.
CPC .......... *H01L 25/0657* (2013.01); *H01L 23/367* (2013.01); *H01L 23/49816* (2013.01); *H01L 25/105* (2013.01); *H01L 23/3675* (2013.01); *H01L 23/5389* (2013.01); *H01L 2023/4056* (2013.01); *H01L 2023/4062* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2225/1023* (2013.01); *H01L 2225/1058* (2013.01); *H01L 2225/1094* (2013.01); *H01L 2924/15311* (2013.01)

(58) Field of Classification Search
CPC ..................... H01L 25/0657; H01L 23/49816; H01L 23/367; H01L 25/105; H01L 2224/16225; H01L 2924/15311; H01L 2224/73265; H01L 2224/73204; H01L 2224/48227; H01L 2224/48091; H01L 2023/4062; H01L 2023/4056; H01L 23/49568; H01L 23/49575; H01L 2225/06589; H01L 2225/06582; H01L 2225/06551; H01L 2225/06548
See application file for complete search history.

(56) References Cited

U.S. PATENT DOCUMENTS 6,525,943 B2 * 2/2003 Moden ................ H01L 23/3675
257/724
6,740,970 B2 * 5/2004 Hiraoka .............. H01L 23/3121
257/707

(Continued)

OTHER PUBLICATIONS

INPI Search Report and Written Opinion for FR 1360584 dated May 23, 2014 (11 pages).

*Primary Examiner* — Roy Potter
(74) *Attorney, Agent, or Firm* — Gardere Wynne Sewell LLP

(57) ABSTRACT

An electronic system includes a first electronic device (with a first integrated-circuit chip) and a second electronic device (with a second integrated-circuit chip). The second electronic device is stacked above the first electronic device on a same side as the first integrated-circuit chip. Electrical connection elements located around the first integrated-circuit chip electrically connected to the second electronic device to the first electronic device. A metal plate configured for heat capture and transfer extends between the first and second electronic devices. The metal plate includes through-passages aligned to permit the electrical connection elements to pass at a distance.

21 Claims, 8 Drawing Sheets

(56) References Cited

U.S. PATENT DOCUMENTS

| | | | |
|---|---|---|---|
| 7,023,079 B2 * | 4/2006 | Wang | H01L 23/16 257/686 |
| 2009/0236733 A1 | 9/2009 | Chow et al. | |
| 2012/0193779 A1 | 8/2012 | Lee et al. | |
| 2013/0075887 A1 | 3/2013 | Suzuki | |
| 2013/0154078 A1 | 6/2013 | Choi et al. | |

* cited by examiner

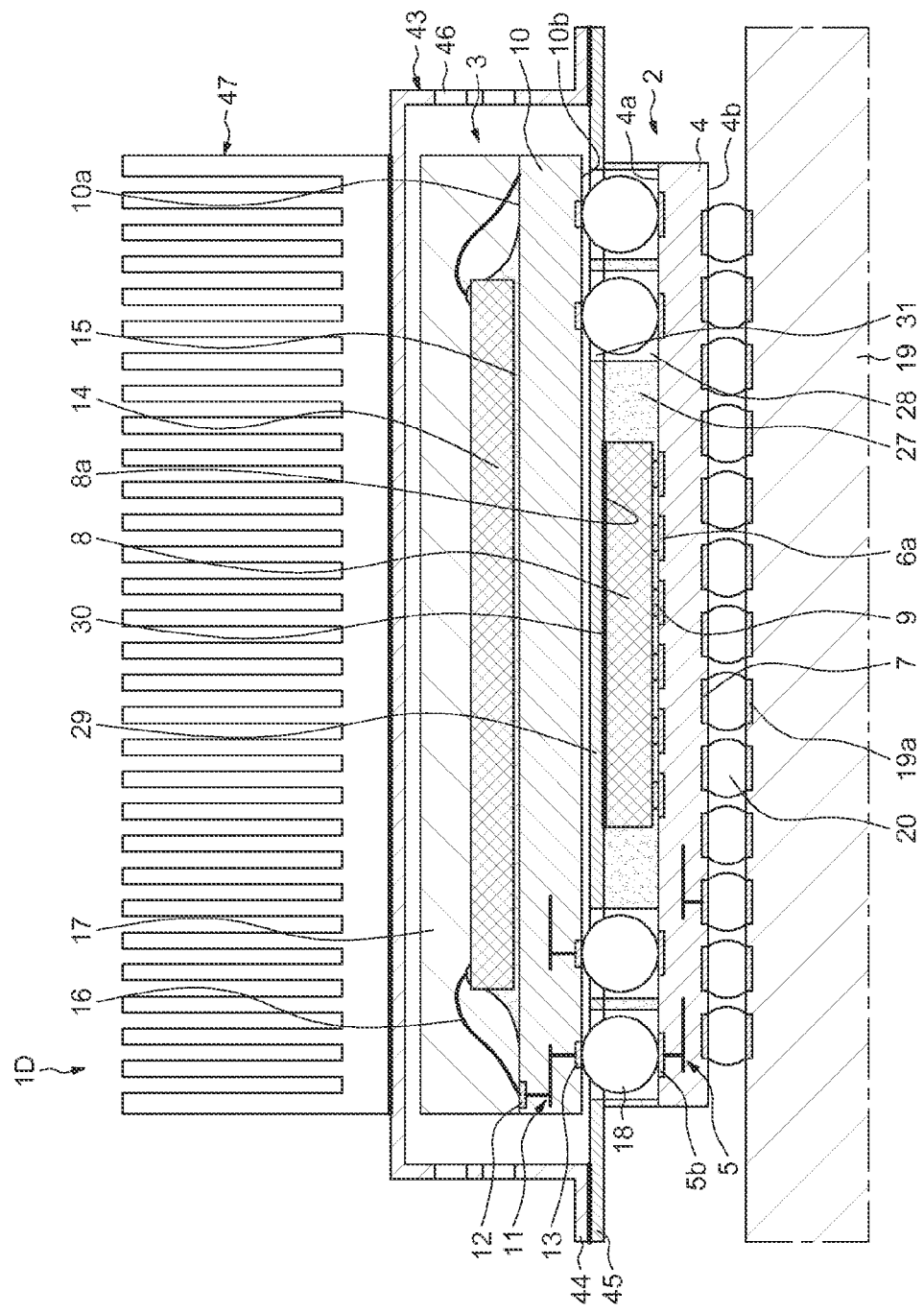

ELECTRONIC SYSTEM COMPRISING STACKED ELECTRONIC DEVICES PROVIDED WITH INTEGRATED-CIRCUIT CHIPS

PRIORITY CLAIM

This application claims priority from French Application for Patent No. 1360584 filed Oct. 30, 2013, the disclosure of which is incorporated by reference.

TECHNICAL FIELD

The present invention relates to the field of microelectronics.

BACKGROUND

It is known to construct electronic systems which comprise electronic devices stacked on one another and electrically connected to one another, each including at least one integrated-circuit chip.

The stacking of electronic devices has, in particular, the advantages of improving the performance of the electrical connections and reducing the size. In some cases, it nevertheless arises that some of the integrated-circuit chips produce heat, and the heat produced heats other integrated-circuit chips and then degrades the performance of the latter. This is the case, in particular, when a first electronic device comprises a processor chip which produces heat and a second electronic device, stacked on the first, comprises a memory chip, the function of which in particular is degraded when its temperature rises.

The circumstances described above constitute an obstacle to increasing the performance of the electronic systems, in particular the program execution speeds. The situation which currently consists in adopting a compromise between the desired performance of the electronic systems and their size is not, however, satisfactory, particularly in the field of portable equipment such as mobile phones.

SUMMARY

One embodiment provides an electronic system which comprises a first electronic device comprising at least one first integrated-circuit chip, and a second electronic device which comprises at least one second integrated-circuit chip, is stacked above the first electronic device, on the same side as the first chip, and is connected to this first electronic device by electrical connection elements located around the first chip.

It is proposed that the first electronic device should be equipped with a metal plate for heat capture and transfer, extending between the first electronic device and the second electronic device, above the first chip, and having through-passages arranged for the electrical connection elements to pass through at a distance.

The metal plate may extend at a distance from the second electronic device.

The metal plate may be in contact above the first electronic device.

A layer of thermal adhesive may be interposed between the metal plate and the first electronic device.

A layer of thermal adhesive may be interposed between the metal plate and the first chip.

The first electronic device may be mounted on a printed-circuit board by means of electrical connection elements, and the metal plate may have an outer part in contact above this printed-circuit board.

A cover may enclose the second electronic device and may have an edge above an outer part of the metal plate.

The outer part may comprise a peripheral strip.

The outer part may comprise tabs.

The cover may have ventilation holes.

A radiator may be mounted above the metal cover.

BRIEF DESCRIPTION OF THE DRAWINGS

Electronic systems according to particular embodiments of the present invention will now be described by way of non-limiting examples, illustrated by the drawing in which:

FIG. 7 represents a cross section of another electronic device.

DETAILED DESCRIPTION OF THE DRAWINGS

Figure 1:
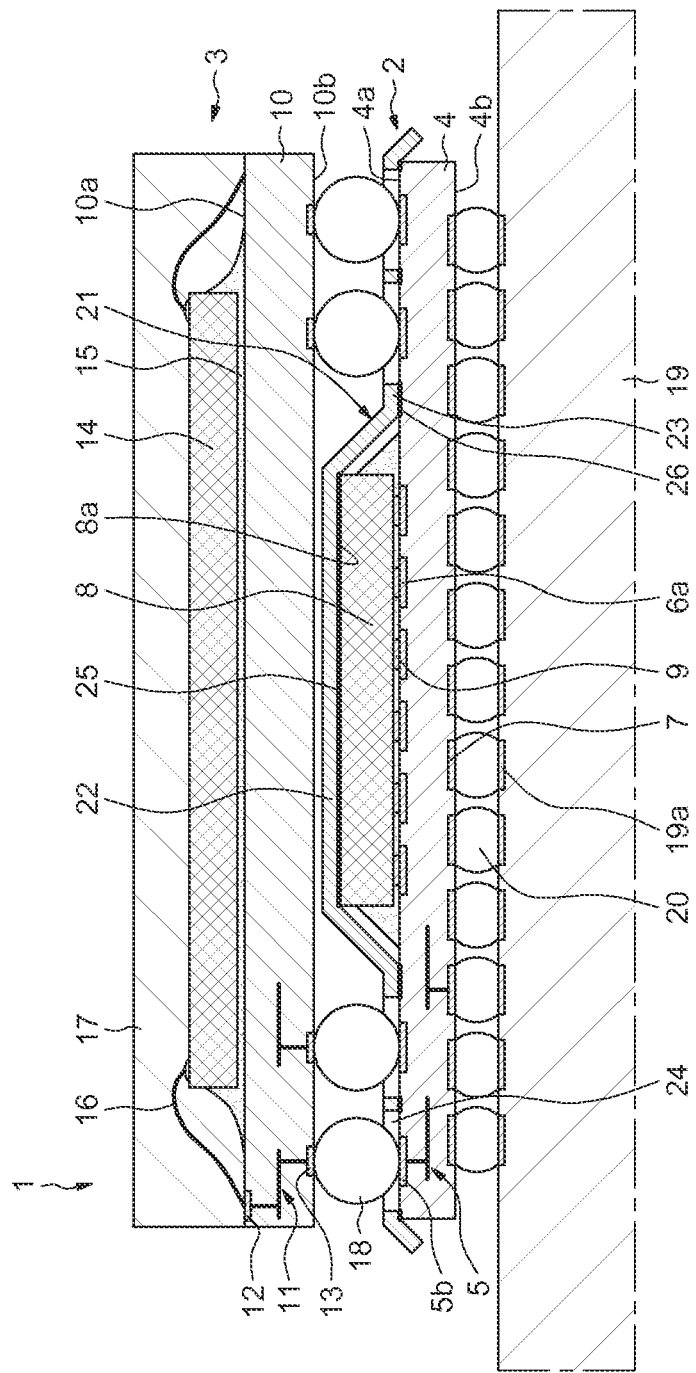
FIG. 1 represents a cross section of an electronic device.

As illustrated in FIG. 1, an electronic system 1 comprises a first electronic device 2 and a second electronic device 3, which are stacked on one another and are at a distance from one another.

The electronic device 2 comprises a substrate wafer 4 provided with an integrated electrical connection network 5 which comprises, on one face 4a, electrical connection pads 6a arranged on its central part and electrical connection pads 6b arranged on its peripheral part and, on its opposite face 4b, electrical connection pads 7.

The electronic device 2 comprises at least one integrated-circuit chip 8 mounted on the substrate wafer 4, on the side of its face 4a, by means of electrical connection elements 9 interposed between the electrical connection pads of the chip 8 and the electrical connection pads 6a of the electrical connection network 5.

The electronic device 3 comprises a substrate wafer 10 provided with an integrated electrical connection network 11 which comprises, on one face 10a, electrical connection pads 12 arranged on its peripheral part and, on its opposite face 10b, electrical connection pads 13 arranged on its peripheral part.

The electronic device 3 comprises at least one integrated-circuit chip 14 mounted above its face 10a by means of a layer of adhesive 15 and electrically connected to the pads 12 of the electrical connection network 11 by means of electrical connection wires 16, the chip 14 and the electrical connection wires being embedded in a layer 17 of an insulating material. According to an alternative embodiment, the chip 14 could be mounted on the substrate wafer 10 by means of electrical connection elements.

The electronic device 3 is mounted on the electronic device 2 by means of electrical connection elements 18, such as metal beads, interposed between the electrical connection pads 6b of the electrical connection network 5 of the electronic device 2 and the electrical connection pads 13 of the electrical connection network 11 of the electronic device 3.

Thus, the face 10b of the substrate wafer 10 lies facing and at a distance from the chip 8 and the face 4a of the substrate wafer 4, the electrical connection elements 18 are located around the chip 8, and the substrate wafer 10 extends between the chip 8 and the chip 14.

The electronic system 1 may be mounted on a printed-circuit board 19 by means of electrical connection elements 20, such as metal beads, interposed between the electrical connection pads 7 of the electrical connection network 5 of the substrate wafer 4 and the electrical connection pads 19a of the printed-circuit board 19.

According to one embodiment, the chip 8 may be a processor chip, the operation of which causes production of heat, and the chip 14 may be a memory chip, the operation of which is liable to be degraded if its temperature becomes too high.

The electronic device 2 is equipped with a metal plate 21 for heat capture and transfer, for example made of copper or aluminum, which extends between the first electronic device 2 and the second electronic device 3, preferably without contact with the second electronic device, so as to at least partly transfer the heat produced by the chip 8 to the substrate wafer 4 and/or to the printed-circuit board 19.

The metal plate 21 comprises a central part 22, which extends flat between the chip 8 of the first electronic device 2 and the substrate wafer 10 of the second electronic device 3.

The metal plate 21 furthermore comprises a peripheral part 23 which at least partially surrounds the central part 22, and which extends flat above the part of the first electronic device 2 located around the chip 8 and has through-passages 24 through which the electrical connection elements 18, connecting the first electronic device 2 and the second electronic device 3, pass without contact or at a distance.

According to the example illustrated in FIG. 1, the metal plate 21 is in the form of a dish in which the chip 8 is located. Its central part 22 is mounted on the face 8a of the chip 8 on the other side from the substrate wafer 4 and the electrical connection elements 9 by means of a layer of thermal adhesive 24. Its peripheral part 23 is mounted on the face 4a of the substrate wafer 4 by means of a layer of thermal adhesive 25, the peripheral edge of this peripheral part 23 extending approximately along the peripheral edge of the substrate wafer 4.

Thus, the heat produced by the chip 8 diffuses preferentially into the substrate wafer 4 and its electrical connection network 5, directly as regards its side facing the substrate wafer 4, and, as regards its side facing away from the substrate wafer 4, indirectly by means of the metal plate 21 which constitutes a thermal barrier between the first electronic device 2 and the second electronic device 3, and a means of preferential heat transfer from the face 8a of the chip 8 to the substrate wafer 4.

The heat of the substrate wafer 4 is then, in particular and preferably, transferred to the printed-circuit board 19 by means of the electrical connection elements 20.

The result of this is that the chip 14 of the second electronic device 3 is protected against any excessive rise in its temperature.

Figure 2A:
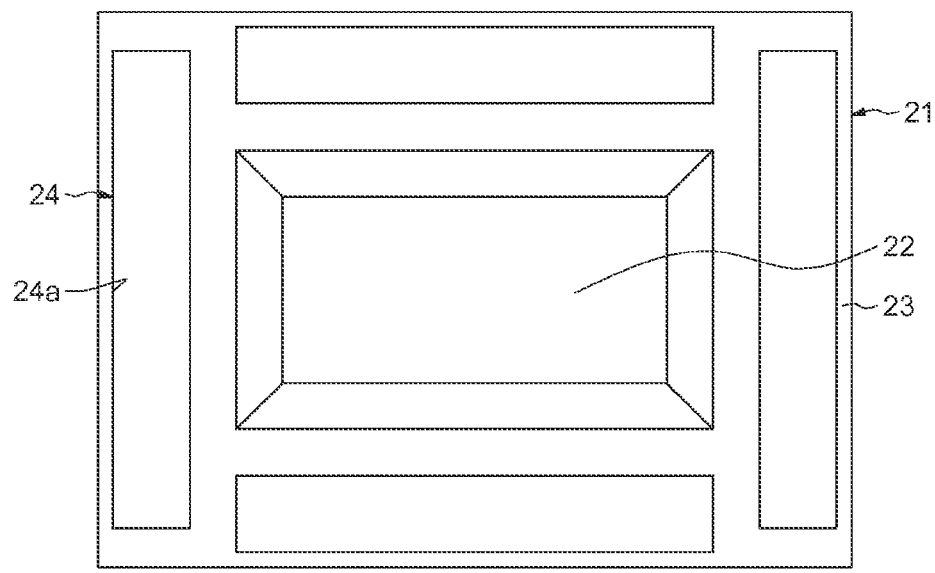
FIGS. 2A and 2B represent views from above of metal plates of the electronic device of FIG. 1.

According to an alternative embodiment illustrated in FIG. 2A, the through-passages 24 have large openings 24a, each for a plurality of electrical connection elements 18 to pass through.

Figure 2B:
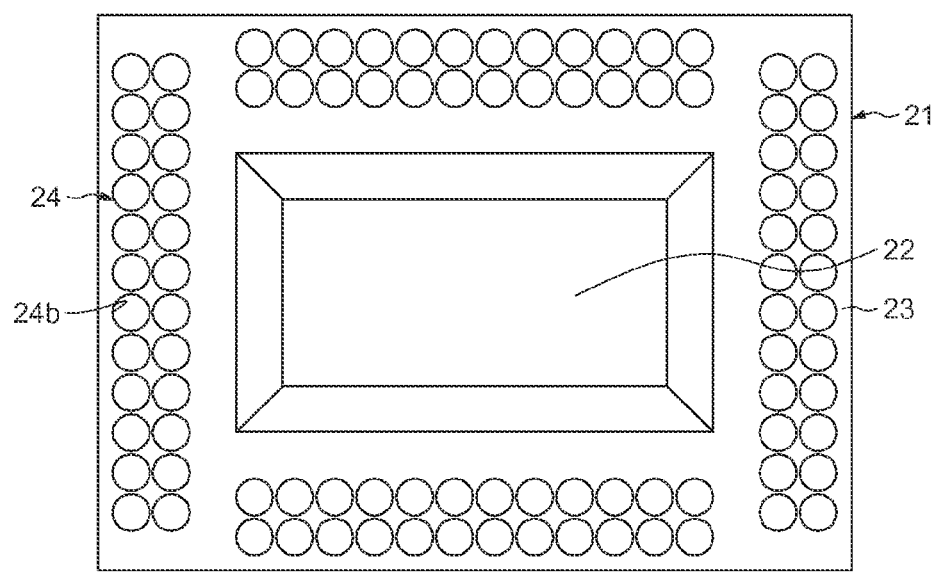

According to another alternative embodiment illustrated in FIG. 2B, the through-passages 24 have individual openings 24b, each for a single electrical connection element 18 to pass through.

Figure 3:
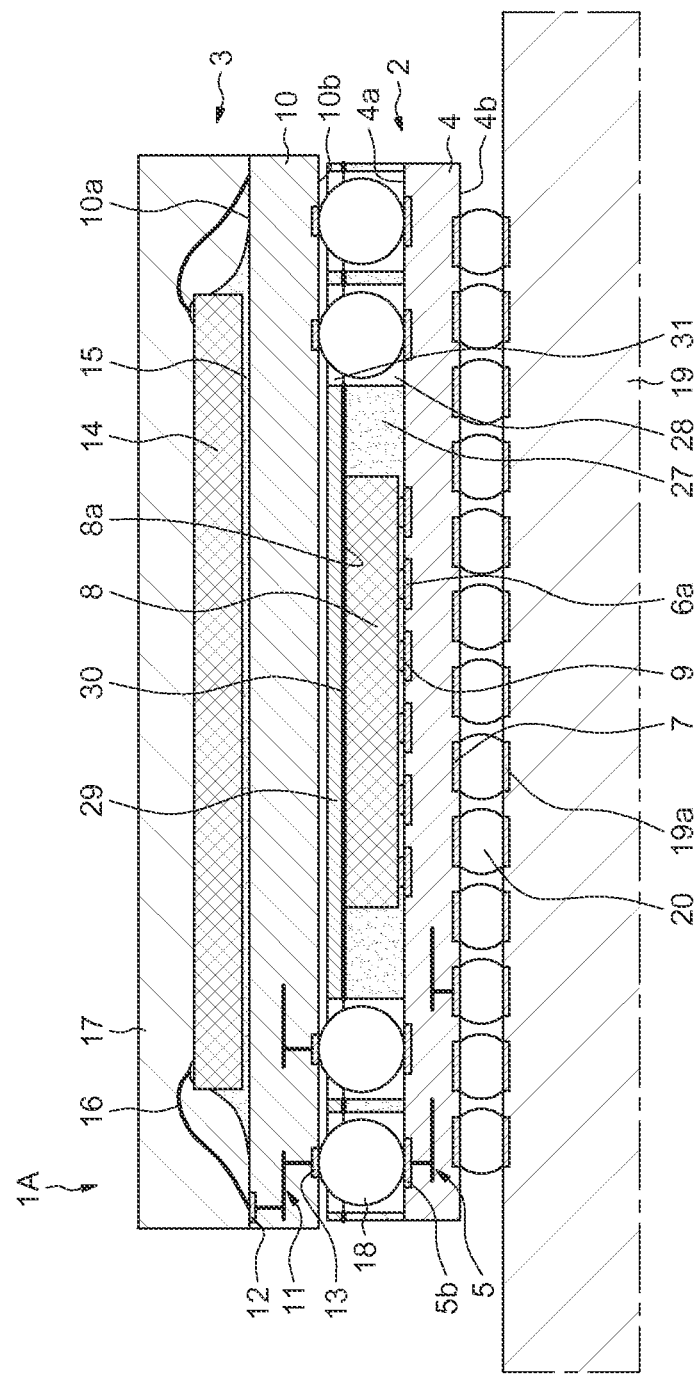
FIG. 3 represents a cross section of another electronic device.

Referring to FIG. 3, another electronic system 1A is illustrated, in which the first electronic device 2 furthermore comprises an encapsulation material forming a block 27 arranged around the chip 8 and on the face 10b of the substrate wafer 4. Openings 28 for passage and placement of the electrical connection elements 18 are arranged in this encapsulation block 27.

According to this example, the metal plate 21 is replaced with a metal heat transfer plate 29 which is flat, and which extends and is mounted above the chip 8 and the encapsulation block 27 by means of a layer of thermal adhesive 30, this metal plate 29 having, like the metal plate 21, through-passages 31 for the electrical connection elements 18 located above the openings 28 to pass through.

Figure 4:
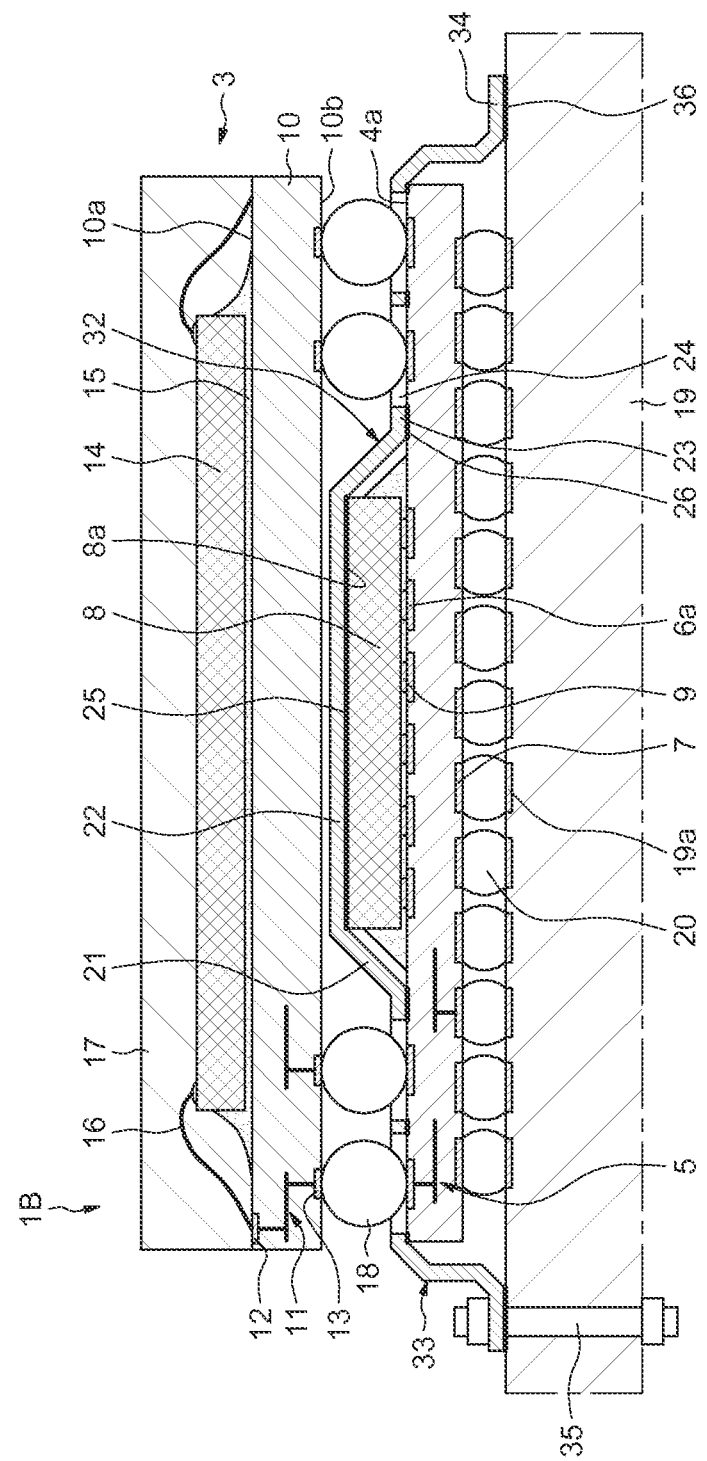
FIG. 4 represents a cross section of another electronic device.

Referring to FIG. 4, another electronic system 1B is illustrated, in which the first electronic device 2, in particular that of FIG. 1, is equipped with a metal heat transfer plate 32 which comprises the metal plate 21 of FIG. 1 and which comprises an outer part 33 extending the peripheral part 23 of the latter and having an end part 34 coming flat above the printed-circuit board 19, around and at a distance from the first electronic device 2.

This outer part 33 may be mounted flat above the printed-circuit board 19 by fastening components 35 and/or by means of a layer of thermal adhesive 36.

Thus, the heat coming from the chip 8 and captured by the metal plate 32 can be at least partly transferred directly to the printed-circuit board 19 by means of its outer part 33.

Figure 5A:
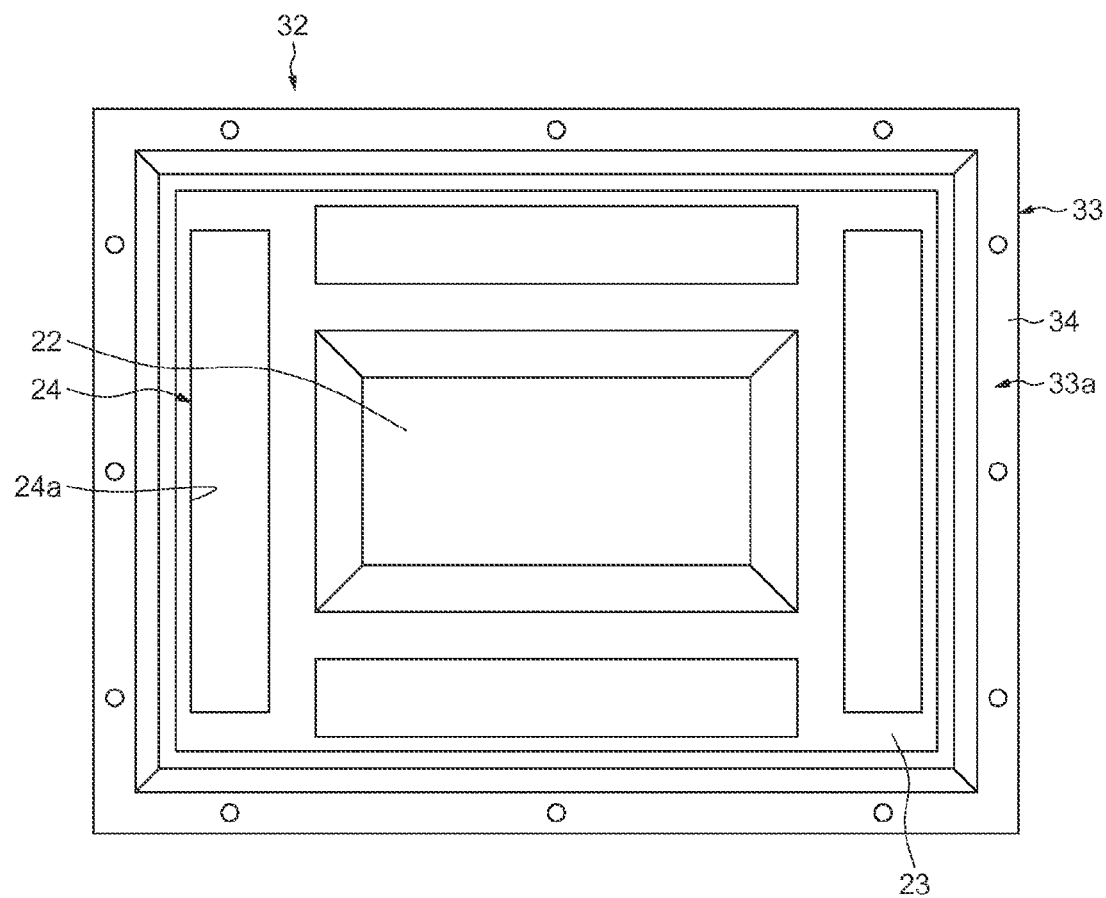
FIGS. 5A, 5B and 5C represent views from above of metal plates of the electronic device of FIG. 4.

As illustrated in FIG. 5A, the outer part 33 of the metal plate 32 may comprise a peripheral strip 33a surrounding the peripheral part 23.

Figure 5B:
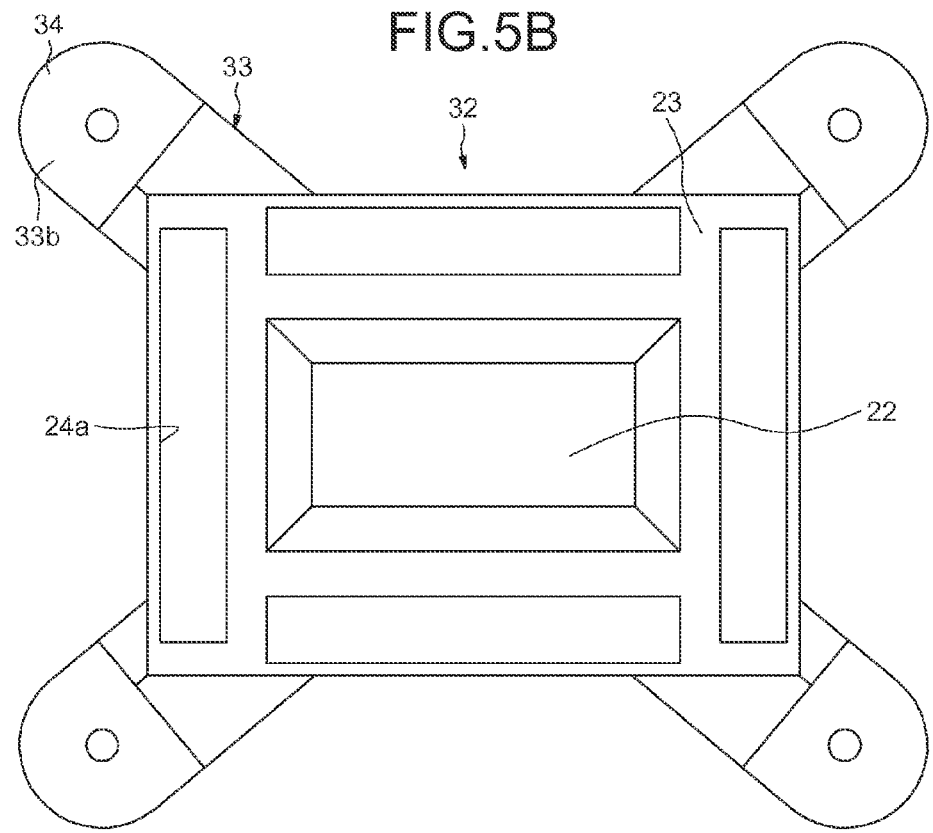

As illustrated in FIG. 5B, the outer part 33 of the metal plate 32 may comprise a plurality of tabs 33b which are spaced apart, extend the peripheral part 23, and are provided for example starting from the corners of the latter.

Figure 5C:
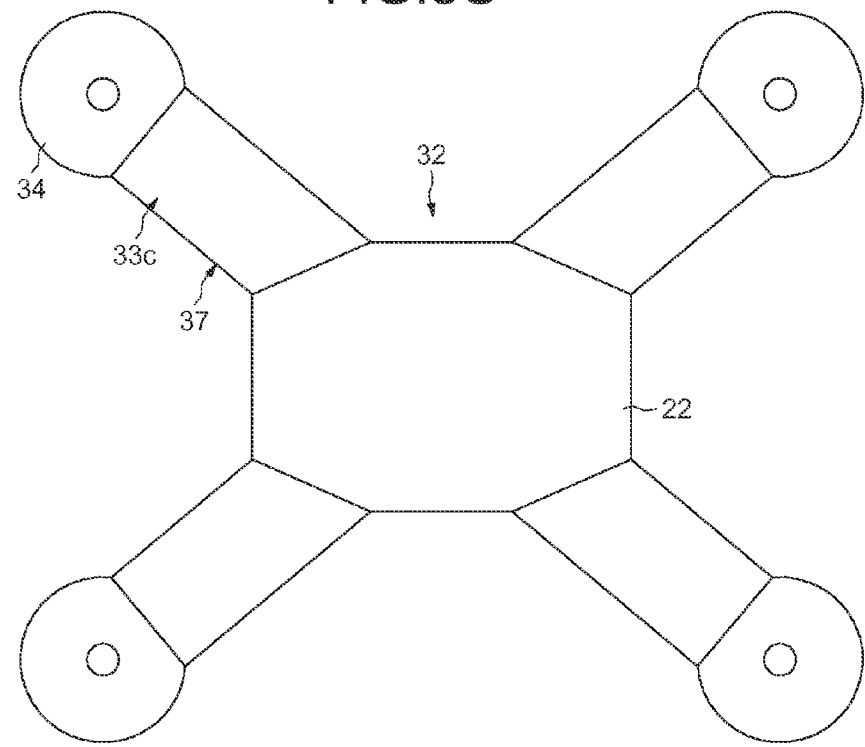

As illustrated in FIG. 5C, the metal plate 32 may comprise only the central part 22 of the metal plate 21 and tabs 33c which are spaced apart, extend the corners of this central part 22, and pass above and at a distance from the corners of the electronic devices 2 and 3. In this case, the through-passages for the electrical connection elements 18 to pass through may be formed by the indentations 37 respectively arranged between the spaced tabs 33c.

According to an alternative embodiment, the metal plate could comprise the metal plate 29 of FIG. 3 instead of the metal plate 21 of FIG. 1.

Figure 6:
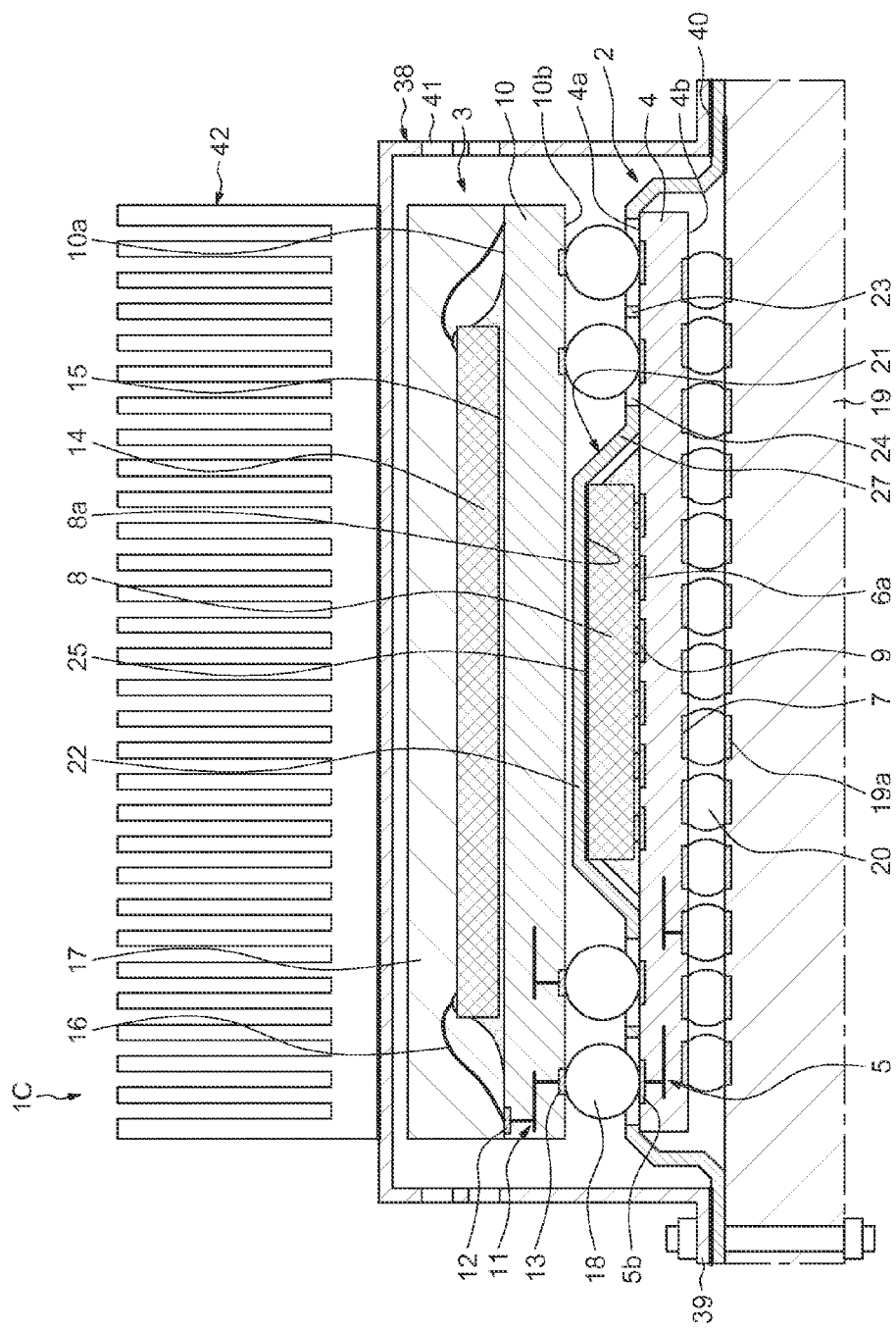
FIG. 6 represents a cross section of another electronic device.

Referring to FIG. 6, another electronic system 1C is illustrated, in which the electronic system 1B of FIG. 4 is furthermore equipped with a metal cover 38 which encloses the second electronic device 3, at least at a distance from the chip 14, and which has an end edge 39 coming above the outer part 34 of the metal plate 32 mounted on the printed-circuit board 19. This edge 39 may be fixed by the fastening components 35 and/or by a layer of adhesive 40.

Furthermore, the metal cover 38 has ventilation holes 41 and may be provided with an external radiator 42 fixed on its part located above and at a distance from the chip 14.

Referring to FIG. 7, another electronic system 1D is illustrated, in which the electronic system 1A of FIG. 3 is furthermore equipped with a metal cover 43 which encloses the second electronic device 3 at a distance, and which has an end edge 44 coming above a protruding peripheral part 45 of the metal plate 29. This end edge 44 and this protruding peripheral part 45 may be fixed by means of fastening components and/or a layer of adhesive.

The metal cover 43 also has ventilation holes 46 and may be provided with an external radiator 47 fixed on its part located above and at a distance from the chip 14.

Thus, the metal covers 38 and 43 and the radiators 41 and 47 can contribute to dissipating the heat produced by the chip 8 into the ambient air, with a view to protecting the chip 14 against an excessive rise in its temperature.

The present invention is not limited to the examples described above. In particular, the metal plates for heat capture and transfer could have very different shapes. Numerous other alternative embodiments are possible without departing from the scope of the invention.

What is claimed is:

1. An electronic system, comprising:
    a printed circuit board,
    a first electronic device comprising at least one first integrated-circuit chip,
    electronic connection elements configured to mount the first electronic device to the printed circuit board,
    a second electronic device comprising at least one second integrated-circuit chip,
    wherein the second electronic device is stacked above the first electronic device on a same side as the first integrated circuit chip and is connected to the first electronic device by electrical connection elements located around the first integrated circuit chip,
    wherein the first electronic device further comprises a metal plate configured for heat capture and transfer that extends between the first electronic device and the second electronic device in a position above the first chip, said metal plate having through-passages arranged for permitting the electrical connection elements to pass through the metal plate at a distance and further including an extension part of the metal plate in contact with the printed circuit board.

2. The system according to claim 1, wherein the metal plate extends separated from the second electronic device.

3. The system according to claim 1, wherein the metal plate is in contact above the first electronic device.

4. The system according to claim 1, wherein a layer of thermal adhesive is interposed between the metal plate and the first electronic device.

5. The system according to claim 1, wherein a layer of thermal adhesive is interposed between the metal plate and the first integrated-circuit chip.

6. The system according to claim 1, wherein the extension part of the metal plate is mounted above the printed circuit board by a fastening element.

7. The system according to claim 1, wherein the extension part of the metal plated is mounted above the printed circuit board by a layer of thermal adhesive.

8. The system according to claim 1, further comprising a cover configured to enclose the second electronic device and having an edge above the extension part of the metal plate.

9. The system according to claim 8, wherein the extension part comprises a peripheral strip.

10. The system according to claim 8, wherein the extension part comprises tabs.

11. The system according to claim 8, wherein the cover has ventilation holes.

12. The system according to claim 8, further comprising a radiator mounted above the metal cover.

13. An electronic system, comprising:
    a first electronic device comprising:
        a first integrated-circuit chip having a front face including first electrical contacts;
        a first substrate having a front face including second electrical contacts and third electrical contacts;
    wherein the front face of the first integrated-circuit chip faces the front face of the first substrate and the first electrical contacts are electrically connected to the second electrical contacts;
    a metal plate configured for heat capture and transfer which includes a center region in contact with a rear face of the first integrated-circuit chip and a peripheral region including openings aligned with the third electrical contacts of the first substrate;
    a second electronic device comprising a second substrate having a rear face including fourth electrical contacts; and
    electrical connections which extend through the openings in the metal plate and electrically connect the fourth electrical contacts to the third electrical contacts.

14. The system of claim 13, wherein the second electronic device comprises a second integrated-circuit chip mounted to a front face of the second substrate and in electrical connection with the fourth electrical contacts.

15. The system of claim 13, wherein a rear face of the first substrate is configured to be mounted to a board and wherein the peripheral region of the metal plate extends past a perimeter of the first substrate and is configured for attachment to a front face of the board.

16. The system of claim 13, wherein the openings in the peripheral region of the metal plate comprise a plurality of openings, each of the plurality of openings corresponding to a single one of the third electrical contacts.

17. The system of claim 13, wherein the openings in the peripheral region of the metal plate comprise a plurality of openings, each of the plurality of openings corresponding to a plurality of the third electrical contacts.

18. The system of claim 13, further comprising a cover which encloses at least the second electronic device.

19. The system of claim 18, wherein the cover is mounted to the peripheral region of the metal plate.

20. The system of claim 18, wherein the cover includes ventilation openings.

21. The system of claim 18, further comprising a thermal radiating structure mounted to said cover.

* * * * *